(12) United States Patent
Yoon et al.

(10) Patent No.: US 7,642,553 B2
(45) Date of Patent: Jan. 5, 2010

(54) THIN FILM TRANSISTOR ARRAY PANEL

(75) Inventors: Joo-Sun Yoon, Seoul (KR); Yong-Ho Yang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 231 days.

(21) Appl. No.: 11/981,914

(22) Filed: Oct. 31, 2007

(65) Prior Publication Data

US 2008/0173900 A1    Jul. 24, 2008

(30) Foreign Application Priority Data

Jan. 24, 2007    (KR)    ............... 10-2007-0007443

(51) Int. Cl.
*H01L 29/04*    (2006.01)
(52) U.S. Cl. .......................... 257/59; 349/40
(58) Field of Classification Search .......... 257/59, 257/72; 349/40
See application file for complete search history.

(56) References Cited

U.S. PATENT DOCUMENTS

| 5,926,234 | A  | * | 7/1999 | Shiraki et al. ............... 349/40 |
| 6,184,948 | B1 | * | 2/2001 | Lee ........................... 349/54 |
| 7,110,057 | B2 |   | 9/2006 | Jeon |

FOREIGN PATENT DOCUMENTS

| JP | 10-268339 | 10/1998 |
| JP | 2002-189428 | 7/2002 |
| JP | 2004-252276 | 9/2004 |
| JP | 2005-252226 | 9/2005 |
| KR | 10-2004-0033413 | 4/2004 |
| KR | 10-2004-0040786 | 5/2004 |
| KR | 10-2005-0040235 | 5/2005 |
| KR | 10-2005-0069023 | 7/2005 |
| KR | 10-2005-0097560 | 10/2005 |
| KR | 10-2006-0011398 | 2/2006 |

OTHER PUBLICATIONS

Patent Abstracts of Japan, Publication No. 10-268339, Oct. 9, 1998, 1 p.

(Continued)

*Primary Examiner*—Thomas L Dickey
(74) *Attorney, Agent, or Firm*—Innovation Counsel LLP

(57) ABSTRACT

A thin film transistor array panel is provided, which includes a substrate including a display region, a chip region, and a pad region; a plurality of signal lines formed on the substrate for electrically connecting the pad region to the chip region and the display region, wherein the signal lines have pads as an end portion and the pads are formed in the pad region; an insulating layer covering the signal lines and having a plurality of contact holes exposing the portions of the signal lines; a plurality of contact assistants formed on the insulating layer and connected to the pads through the contact holes; and a plurality of connection member respectively connected to the contact assistants and formed on the insulating layer for selectively electrically connecting the signal lines, wherein the insulating layer has a boundary line formed by etching, and the boundary line is crenellated.

9 Claims, 8 Drawing Sheets

OTHER PUBLICATIONS

Patent Abstracts of Japan, Publication No. 2002-189428, Jul. 5, 2002, 1 p.
Patent Abstracts of Japan, Publication No. 2004-252276, Sep. 9, 2004, 1 p.
Patent Abstracts of Japan, Publication No. 2005-252226, Sep. 15, 2005, 1 p.
Korean Patent Abstracts, Publication No. 1020040033413, Apr. 28, 2004, 1 p.
Korean Patent Abstracts Publication No. 1020040040786, May 13, 2004, 1 p.
Korean Patent Abstracts Publication No. 1020050040235, May 3, 2005, 1 p.
Korean Patent Abstracts Publication No. 1020050069023, Jul. 5, 2005, 1 p.
Korean Patent Abstracts Publication No. 1020050097560, Oct. 10, 2005, 2 pp.
Korean Patent Abstracts Publication No. 1020060011398, Feb. 3, 2006, 1 p.

* cited by examiner

THIN FILM TRANSISTOR ARRAY PANEL

CROSS-REFERENCE TO RELATED APPLICATION

This application claims priority to and the benefit of Korean Patent Application No. 10-2007-0007443 filed in the Korean Intellectual Property Office on Jan. 24, 2007, the entire contents of which are incorporated herein by reference.

BACKGROUND OF THE INVENTION (a) Field of the Invention

The present invention relates to a thin film transistor array panel.

(b) Description of Related Art

Generally, a liquid crystal display (LCD) includes a liquid crystal (LC) panel unit including two panels provided with pixel electrodes and a common electrode, and an LC layer with dielectric anisotropy interposed therebetween.

The pixel electrodes are arranged in a matrix and are connected to switching elements such as thin film transistors (TFTs) to be sequentially applied with a data voltage for each row. The common electrode covers the entire surface of the upper panel and is supplied with a common voltage. A pixel electrode, the common electrode, and the LC layer form an LC capacitor in a circuit, and the LC capacitor together with a switching element connected thereto is a basic unit of a pixel.

The LCD displays images by applying an electric field to the LC layer disposed between the two panels and regulating the strength of the electric field to adjust transmittance of light passing through the LC layer.

The LCD, which is used as a small and medium sized display device such as a portable telephone, includes a display panel assembly, a driving flexible printed circuit (FPC) provided with signal lines to transmit input signals from external devices, and an integration chip that controls the above-described elements.

The LCD includes a panel unit provided with pixels including switching elements and signal lines for displaying images, a gate driver providing a gate-on voltage and a gate-off voltage for gate lines of the display signal lines to turn on/off the switching elements, and a data driver providing a data signal for data lines of the display signal lines to apply a data voltage to the pixels via the turned-on switching elements. The integration chip generates control signals and driving signals for controlling the panel unit and is generally mounted as a COG (chip on glass).

Also, pad portions, in which a plurality of pads are formed in a predetermined number, are arranged on the edges of the integration chip. The pads are electrically connected to the signal lines of the panel for receiving the signal applied to the inner portion of the panel or the integration chip, and the FPC is connected to the pad portion as a FOG (film on glass). In the manufacturing process, the plurality of pads are commonly electrically connected with a common connecting member for preventing the elements such as the thin film transistors from being damaged by electrostatic energy generated in the manufacturing process, and the common connection member is separated from the plurality of pads for electrically insulating the plurality of pads from each other.

However, conductive particles may remain due to steps of the insulating layer formed in the panel in the portion where the common connection member and the pads are connected to each other in the manufacturing process, such that signal drive level defects may occur.

SUMMARY OF THE INVENTION

The present invention is directed to solving such conventional problems as conductive particle contamination.

A thin film transistor array panel is provided, which includes a substrate including a display region, a chip region, and a pad region; a plurality of signal lines formed on the substrate for electrically connecting the pad region to the chip region and the display region, wherein the signal lines have pads as an end portion and the pads are formed in the pad region; an insulating layer covering the signal lines and having a plurality of contact holes exposing the portions of the signal lines; a plurality of contact assistants formed on the insulating layer and connected to the pads through the contact holes; and a plurality of connection members respectively connected to the contact assistants and formed on the insulating layer for commonly electrically connecting the signal lines, wherein the insulating layer has a boundary line which includes first and second portions. In one embodiment the boundary line is a crenellated pattern.

Protruded portions of the insulating layer defined by portions of the boundary line may be respectively disposed corresponding to the connection members.

Each protruded portion of the insulating layer may overlap a connection member.

The boundary line of the insulating layer may be partially cut.

The portion of the insulating layer overlapping the connection member may be exposed by the boundary of the substrate.

The cut boundary lines of the insulating layer may be respectively disposed between the neighboring connection members.

The boundary line of the insulating layer may be partially cut, and the cut boundary lines of the insulating layer may be disposed outside two connection members disposed at the edge.

The portion of the insulating layer between two connection members disposed in the edge is exposed by the boundary of the substrate.

The driving chip mounted on the chip region may be attached in a chip on glass (COG) mode.

BRIEF DESCRIPTION OF THE DRAWINGS

The present invention will become more apparent by describing preferred embodiments thereof in detail with reference to the accompanying drawings, in which.

DETAILED DESCRIPTION OF EMBODIMENTS

Figure 1:
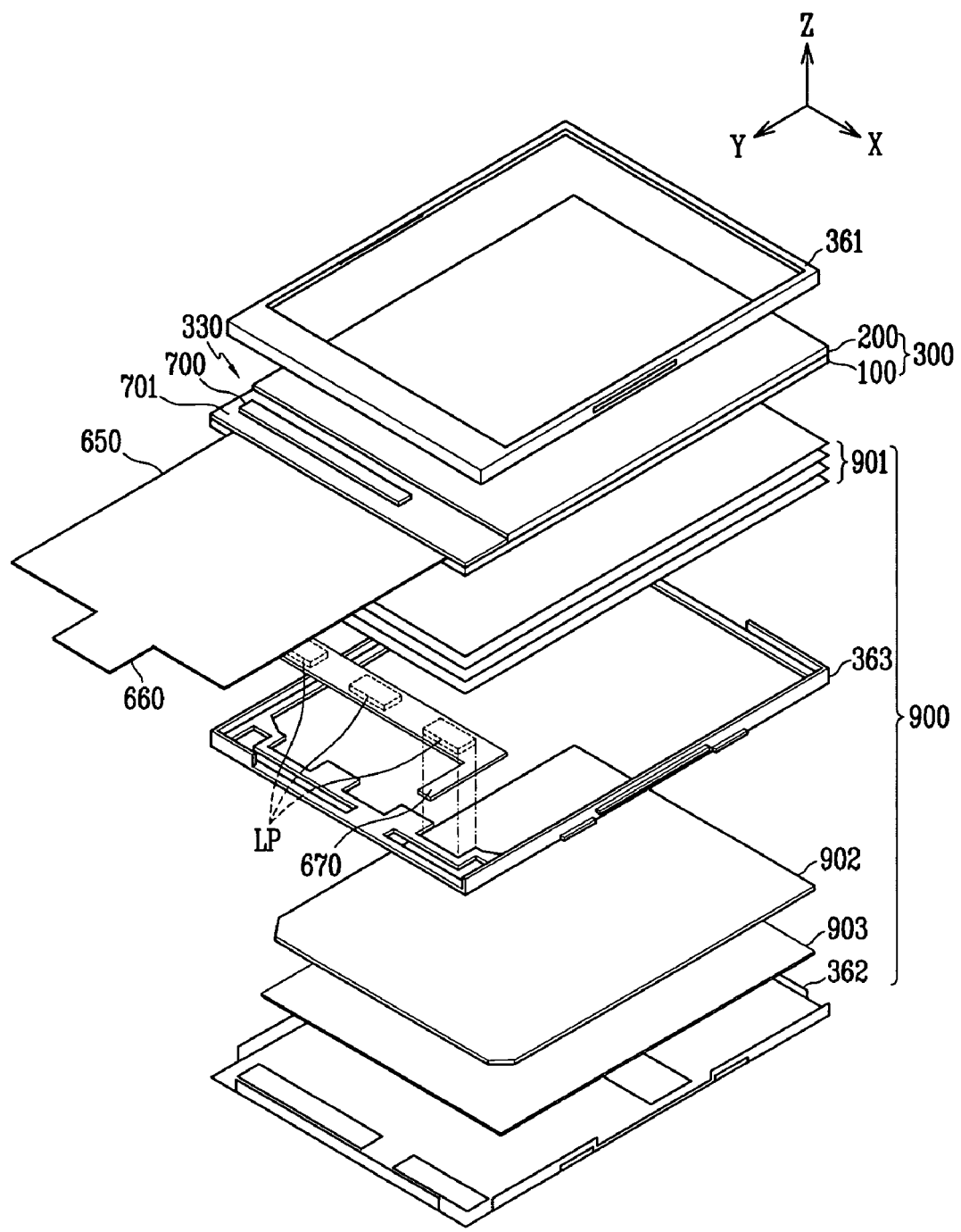
FIG. 1 is an exploded perspective view of an LCD according to an exemplary embodiment of the present invention.

The present invention will be described more fully hereinafter with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, film, region, substrate, or panel is referred to as being "on" another element, it can be directly on the other element or intervening elements may also be present. In contrast, when an element is referred to as being "directly on" another element, there are no intervening elements present.

A liquid crystal display according to an embodiment of the present invention will now be described in detail with reference to FIGS. 1 to 4.

Figure 2:
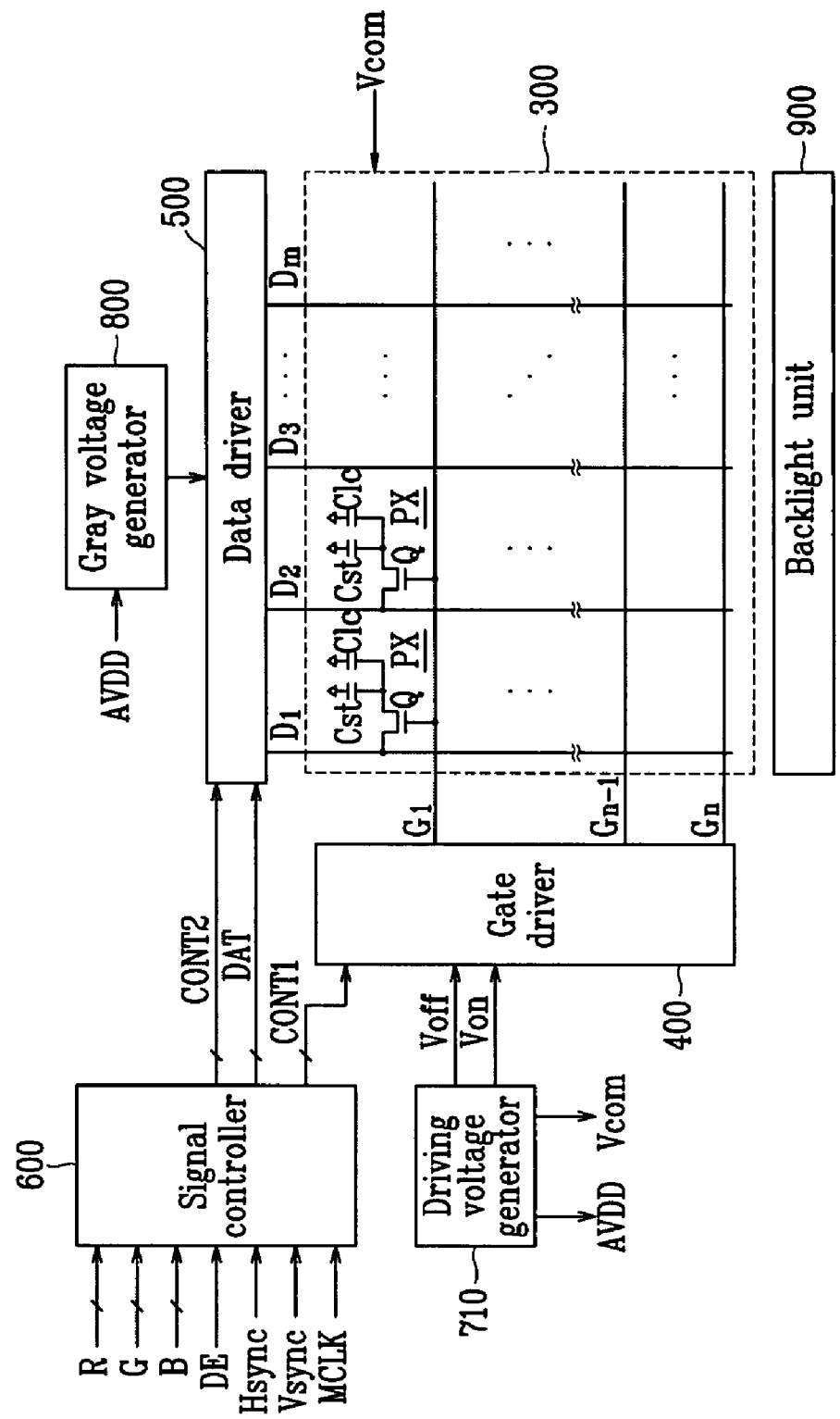
FIG. 2 is a block diagram of an LCD according to an exemplary embodiment of the present invention.
Figure 3:
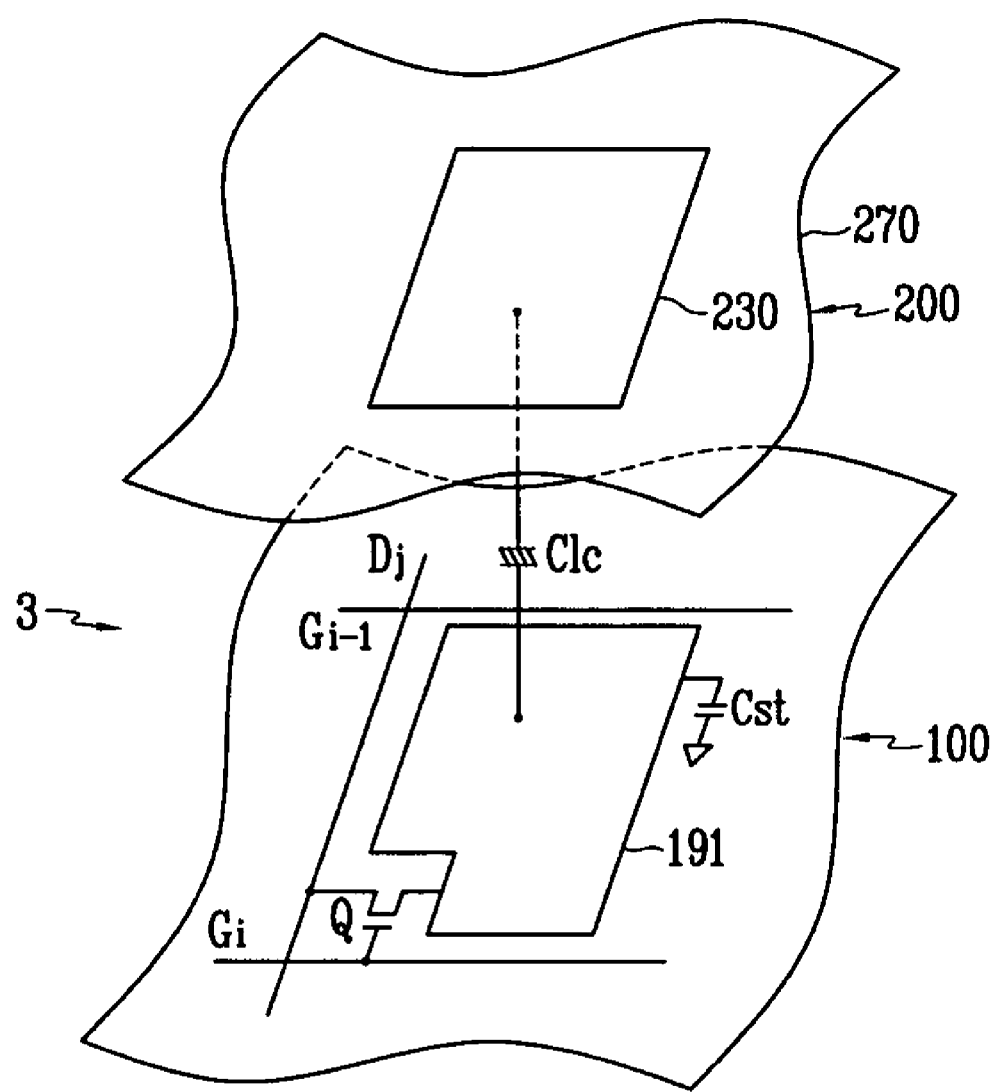
FIG. 3 is an equivalent circuit diagram of a pixel of an LCD according to an exemplary embodiment of the present invention.
Figure 4:
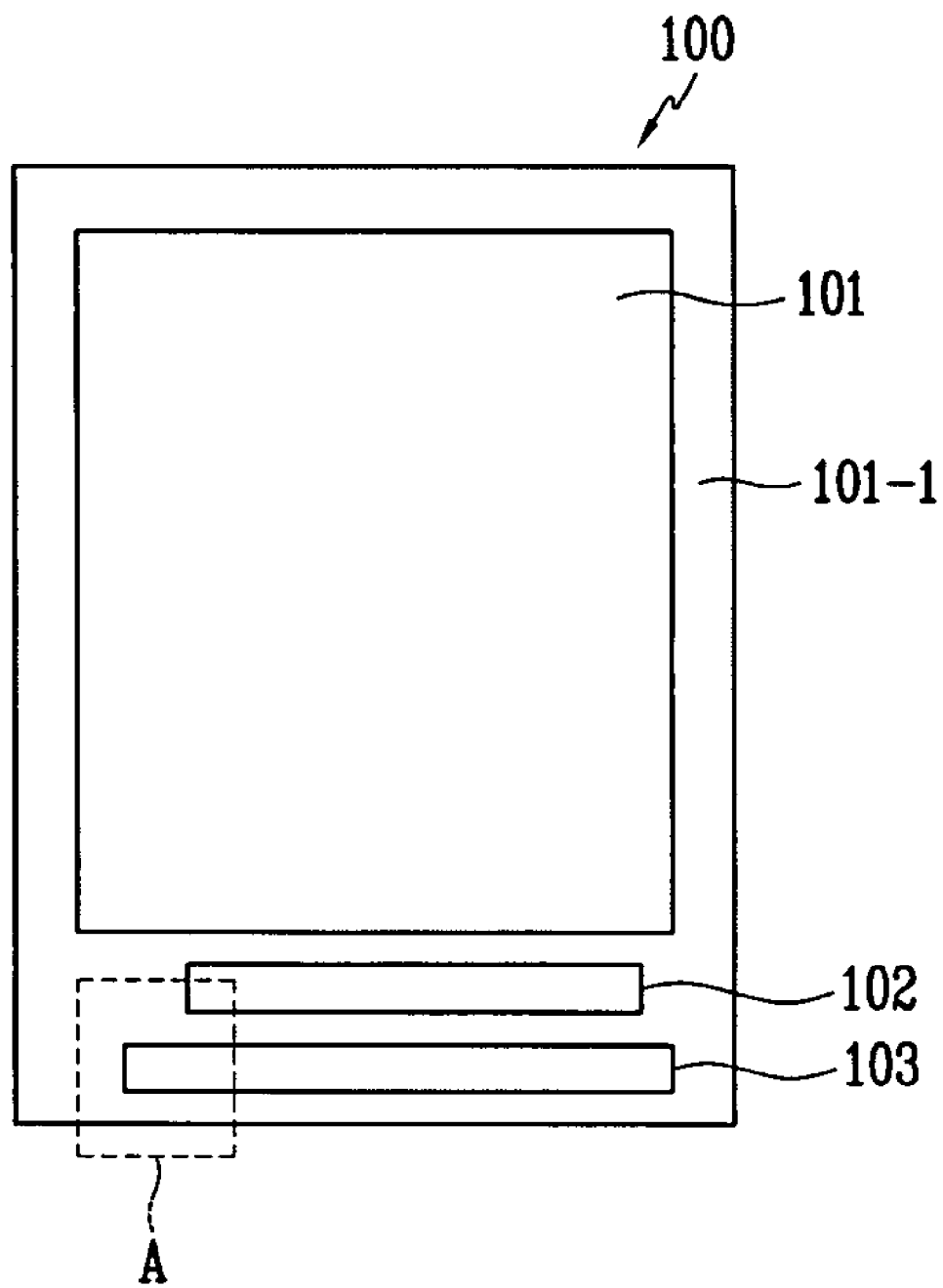
FIG. 4 is a plan view of a thin film transistor array panel of an LCD according to an exemplary embodiment of the present invention.

FIG. 1 is an exploded perspective view of an LCD according to an exemplary embodiment of the present invention, FIG. 2 is a block diagram of an LCD according to an exemplary embodiment of the present invention, FIG. 3 is an equivalent circuit diagram of a pixel of an LCD according to an exemplary embodiment of the present invention, and FIG. 4 is a schematic view of a thin film transistor array panel of an LCD according to an exemplary embodiment of the present invention.

Referring to FIG. 1, an LCD according to an exemplary embodiment of the present invention includes an LC module having a display panel 330 and a backlight unit 900, front and rear chassis 361 and 362 containing the LC module, and a molded frame 363.

The display panel 330 includes an LC panel assembly 300, an integrated chip 700 mounted on the LC panel assembly 300, a passivation layer 701 formed on the circumference of the integrated chip 700, and a flexible printed circuit board 650 electrically/physically connected to the LC panel assembly 300 and the integrated chip 700.

In the structural view shown in FIG. 2, the panel assembly 300 includes a plurality of signal lines $G_1$-$G_n$ and $D_1$-$D_m$, and a plurality of pixels PX connected to the display signal lines $G_1$-$G_n$ and $D_1$-$D_m$ and arranged substantially in a matrix. Most portions of the display signal lines $G_1$-$G_n$ and $D_1$-$D_m$, and the pixels PX are disposed in a display region 101 (referring to FIG. 4). Because an upper panel 200 is smaller than a lower panel 100, a portion of the lower panel 100 is exposed by the upper panel 200, and the exposed portion of the lower panel 100 is a chip region 102 (referring to FIG. 4) in which the integrated chip 700 is disposed.

The display signal lines include a plurality of gate lines $G_1$-$G_n$ transmitting gate signals (also referred to as "scanning signals" hereinafter) and a plurality of data lines $D_1$-$D_m$ transmitting data voltages. The gate lines $G_1$-$G_n$ extend substantially in a row direction and substantially parallel to each other, while the data lines $D_1$-$D_m$ extend substantially in a column direction and substantially parallel to each other.

Referring to FIG. 2, each pixel PX, for example a pixel PX connected to the i-th gate line $G_i$ (i=1, 2, . . . , n) and the j-th data line $D_j$ (j=1, 2, . . . , m), includes a switching element Q connected to the display signal lines $G_i$ and $D_j$, and an LC capacitor Clc and a storage capacitor Cst that are connected to the switching element Q. The storage capacitor Cst may be omitted.

The switching element Q is disposed on the lower panel 100 and has three terminals, i.e., a control terminal connected to the gate line $G_i$, an input terminal connected to the data line $D_j$, and an output terminal connected to the LC capacitor Clc and the storage capacitor Cst.

As shown in FIG. 3, the panel assembly 300 includes the lower panel 100, the upper panel 200 facing the lower panel 100, and an LC layer 3 interposed between the panels 100 and 200, and the display signal lines $G_1$-$G_n$ and $D_1$-$D_m$ and the switching elements Q are provided in the lower panel 100.

The LC capacitor Clc includes a pixel electrode 191 disposed on the lower panel 100 and a common electrode 270 disposed on the upper panel 200 as two terminals. The LC layer 3 disposed between the two electrodes 191 and 270 functions as a dielectric of the LC capacitor Clc. The pixel electrode 191 is connected to the switching element Q, and the common electrode 270 is supplied with a common voltage Vcom and covers an entire surface of the upper panel 200. Unlike in FIG. 2, the common electrode 270 may be provided on the lower panel 100, and at least one of the electrodes 191 and 270 may have a shape of a bar or a stripe.

The storage capacitor Cst is an auxiliary capacitor for the LC capacitor Clc. The storage capacitor Cst includes the pixel electrode 191 and a separate signal line, which is provided on the lower panel 100, and it overlaps the pixel electrode 191 via an insulator and is supplied with a predetermined voltage such as the common voltage Vcom. Alternatively, the storage capacitor Cst includes the pixel electrode 191 and an adjacent gate line called a previous gate line, which overlaps the pixel electrode 191 via an insulator.

For color display, each pixel uniquely represents one of primary colors (i.e., spatial division) or each pixel sequentially represents the primary colors in turn (i.e., temporal division) such that a spatial or temporal sum of the primary colors is recognized as a desired color. An example of a set of the primary colors includes red, green, and blue colors. FIG. 3 shows an example of the spatial division in which each pixel includes a color filter 230 representing one of the primary colors in an area of the upper panel 200 facing the pixel electrode 191. Alternatively, the color filter 230 may be provided on or under the pixel electrode 191 on the lower panel 100.

One or more polarizers (not shown) are attached to the panel assembly 300.

Referring to FIG. 1 and FIG. 2 again, the integrated chip 700 controls the LC panel assembly 300 for receiving external signals via signal lines (not shown) formed on a connection portion 660 and the flexible printed circuit board 650, and supplying the modified signals to the panel assembly 300 via the signal lines (not shown) formed on the peripheral region 101-1 (excluding the display region) of the LC panel assembly 300. As shown in FIG. 2, the integrated chip 700 includes a driving voltage generator 710, a gray voltage generator 800, a gate driver 400, a data driver 500, and a signal controller 600.

The flexible printed circuit board 650 is attached on a pad region 103 disposed at the circumference of the one side of the LC panel assembly 300 and includes the connection portion 660 for receiving an external signal. The flexible printed circuit board 650 provides a plurality of signal lines (not shown) for electrically connecting the connection portion 660 to the integrated chip 700 and the integrated chip 700 to the LC panel assembly 300.

As shown in FIG. 4, the LC panel assembly 300 includes the display region 101 and the peripheral region 101-1 excluding the display region 101, and the peripheral region 101-1 may have a light blocking member (a black matrix) for blocking leakage of light.

The driving voltage generator 710 generates a plurality of voltages for driving a plurality of circuit elements such as gate voltages Von and Voff, a reference voltage AVDD, and a common voltage Vcom.

The gate driver 400 is connected to the gate lines $G_1$-$G_n$ of the LC panel assembly 300, and synthesizes a gate-on voltage Von and a gate-off voltage Voff to generate the gate signals for application to the gate lines $G_1$-$G_n$.

The gray voltage generator 800 generates a full number of gray voltages or a limited number of gray voltages (referred to as "reference gray voltages" hereinafter) related to the transmittance of the pixels PX, based on the reference voltage AVDD from the driving voltage generator 710. Some of the (reference) gray voltages have a positive polarity relative to the common voltage Vcom, while the other of the (reference) gray voltages have a negative polarity relative to the common voltage Vcom.

The data driver 500 is connected to the data lines $D_1$-$D_m$ of the panel assembly 300 and applies data voltages, which are selected from the gray voltages supplied from the gray voltage generator 800, to the data lines $D_1$-$D_m$. However, when the gray voltage generator 800 generates only a few of the reference gray voltages rather than all the gray voltages, the data driver 500 may divide the reference gray voltages to generate the data voltages among the gray voltages.

The signal controller 600 controls the gate driver 400 and the data driver 500, etc., and is electrically connected to a backlight unit 900.

The backlight unit 900 includes lamps LP, circuit elements (not shown), to control the lamps LP, a printed circuit board (PCB) 670, a light guide plate 902, a reflective sheet 903, and a plurality of optical sheets 901.

The lamps LP are disposed on the PCB 670 positioned near an edge of a short side of the mold frame 363, and supply light toward the LC panel assembly 300.

The light guide plate 902 guides the light from the lamps LP toward the LC panel assembly 300 and uniformly maintains the intensity of the light.

The reflective sheet 903 is positioned under the light guide plate 902 and reflects the light from the lamps LP toward the LC panel assembly 300.

The optical sheets 901 are positioned over the light guide plate 902 and guarantee luminance characteristics of the light from the lamps LP.

The front chassis 361 and the rear chassis 362 combine in the molded frame 363, and contain the LC module therein to complete the LCD.

Here, because the lower panel 100 includes the thin film transistors, it is called a thin film transistor array panel. As above-described, the thin film transistor array panel 100 includes the display region 101 for displaying the images, the chip region 102 in which the integrated chip to output the signals for driving the display region 101 is mounted, and the pad region 103 to which the flexible printed circuit board 650 for supplying the external signals for the chip region 102 and the display region 101 is connected.

In the manufacturing process of this thin film transistor array panel 100, the display signal lines G1-Gn and D1-Dm, the pixel electrodes 191, and the thin film transistors are formed by using a plurality of photolithography processes. Here, the display signal lines G1-Gn and D1-Dm and the thin film transistors are electrically connected to each other via a common connection member to effectively discharge electrostatic energy generated in the manufacturing process. The common connection member is commonly connected to a plurality of pads connected to the end portions of the signal lines that are connected to the display signal lines G1-Gn and D1-Dm and the thin film transistors, and is separated from the pads to divide the portion of the panel in the final step of the manufacturing process to electrically isolate the pads from each other. However, conductive particles may remain due to the steps of the insulating layer formed in the panel in the portion where the common connection member and the pads are connected to each other in the manufacturing process, such that degradation of driving signals may occur.

To solve these problems in the embodiments according the present invention, the step of the insulating layer is changed with various shapes, and will be described in detail with reference to the drawings.

Figure 5:
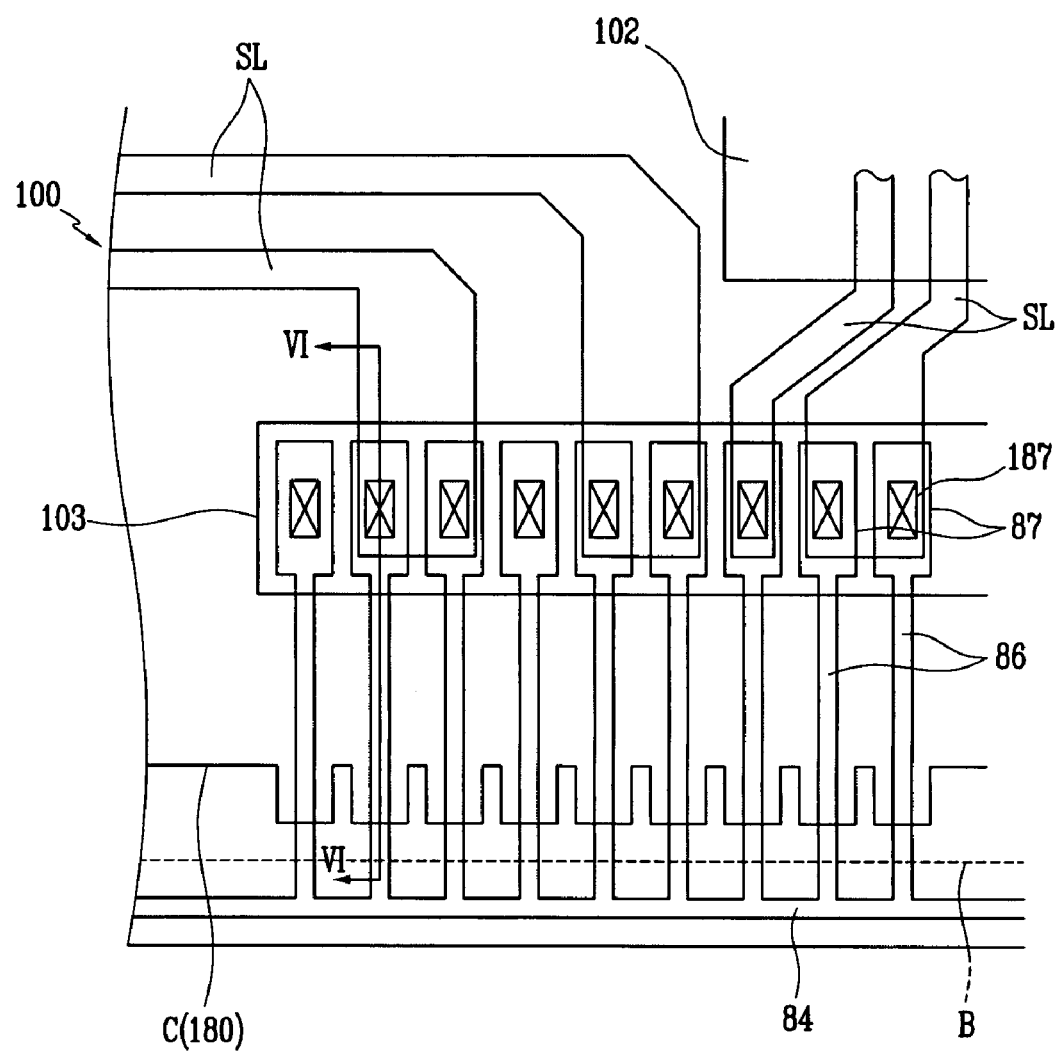
FIG. 5 is an enlarged view of the portion A of the thin film transistor array panel shown in FIG. 4.
Figure 6:
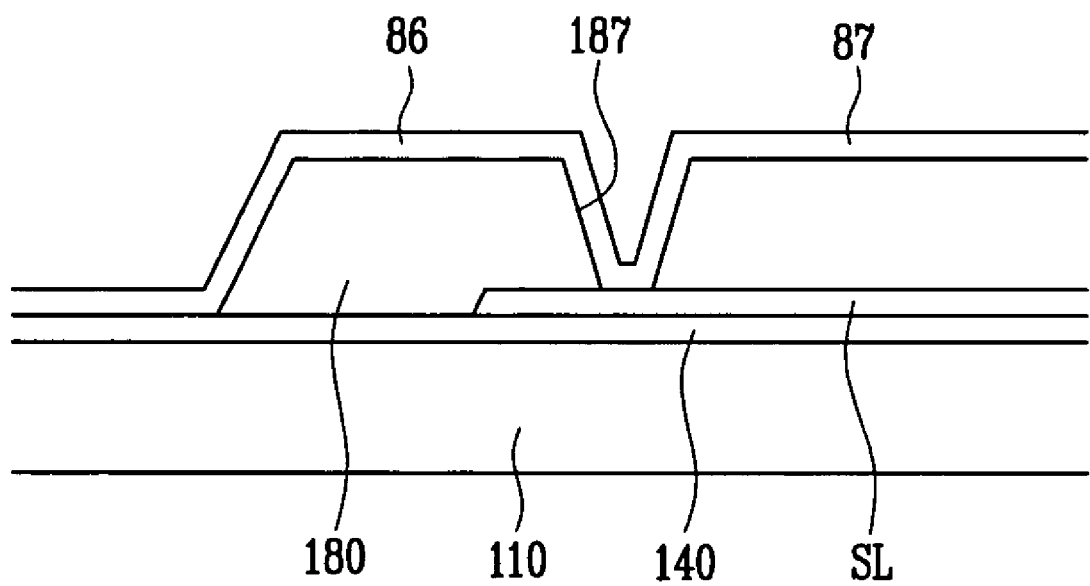
FIG. 6 is a cross-sectional view of the thin film transistor array panel shown in FIG. 5 taken along line VI-VI.

FIG. 5 is an enlarged view of the portion A of the thin film transistor array panel shown in FIG. 4, and FIG. 6 is a cross-sectional view of the thin film transistor array panel shown in FIG. 5 taken along line VI-VI.

A first insulating layer 140 preferably made of silicon nitride (SiNx) or silicon oxide (SiOx) is formed on an insulating substrate 110, and a plurality of signal lines SL that are electrically/physically connected to the display signal lines G1-Gn and D1-Dm are formed thereon.

Portions among the signal lines SL are extended from the chip region 102, and the remaining portions of the signal lines SL are extended from the display region (not shown) or the peripheral area (not shown). The end portions of the signal lines SL are gathered in the pad region 103 with wide areas as pads, and the pad region 103 is disposed adjacent to the chip region 102. The flexible printed circuit board 650 is connected to the pad region 103 to electrically connect the flexible printed circuit board 650 and the LC panel assembly 300. An anisotropically conductive film may be used to electrically connect the flexible printed circuit board 650 and the LC panel assembly 300 in the manufacturing steps thereafter.

On the other hand, the first insulating layer 140 may only cover the portions of the display signal lines G1-Gn and D1-Dm, and the signal lines SL may be disposed under the first insulating layer 140 with the same layer as the display signal lines G1-Gn and D1-Dm. Also, the first insulating layer 140 may be a gate insulating layer that is disposed between a gate electrode and a semiconductor layer.

A second insulating layer 180 is formed on the signal lines SL and the first insulating layer 140. The second insulating layer 180 is preferably made of an inorganic or organic insulator, and it may have a flat top surface. Examples of the inorganic insulator include silicon nitride and silicon oxide. The organic insulator may have photosensitivity and a dielectric constant of less than about 4.0, such as a-Si:C:O and a-Si:O:F formed by plasma enhanced chemical vapor deposition (PECVD). The second insulating layer may be a passivation layer to protect the semiconductor layer thereunder, and the second insulating layer 180 may include a lower film of an inorganic insulator and an upper film of an organic insulator such that it takes the excellent insulating characteristics of the organic insulator while preventing the exposed portions of the semiconductor layer from being damaged by the organic insulator.

In FIG. 5, the solid line C indicates the boundary line of the second insulating layer 180, and the boundary line C of the second insulating layer 180 is formed by etching in the photolithography process, and is crenellated. Other configurations in which portions of the boundary line are located at different distances along the edge thereof will of course achieve the goal described herein.

The second insulating layer 180 has a plurality of contact holes 187 exposing the end portions of the signal lines SL. When the signal lines SL are disposed under the first insulating layer 140, the contact holes 187 may be extended through the first insulating layer 140, and be made of large members corresponding to each contact hole 187.

A plurality of contact assistants 87, a plurality of connection members 86, and a common connection member 84 are formed on the second insulating layer 180. They are preferably made of a transparent conductor such as indium tin oxide (ITO), amorphous ITO (a-ITO), or indium zinc oxide (IZO), and it is preferable that they are at the same layer as the pixel electrode.

The contact assistants 87 are connected to the end portions of the signal lines SL through the contact holes 187, respectively. The contact assistants 87 protect the end portions, and enhance adhesion between the end portions and external devices.

Each connection member 86 is connected to a contact assistant 87, and is extended beyond the cutting line B that is indicated by a dotted line. The plurality of connection members 86 are connected to the common connection member 84. Accordingly, the plurality of signal lines SL are commonly connected to each other such that they are protected from electrostatic energy that may be generated in the manufacturing process such as a rubbing step of an alignment layer. Next, the portion of the insulating substrate 110 is cut at the cutting line B after completing the thin film transistor array panel 100. Therefore, the common connection member 84 is divided from the contact assistants 87, and the signal lines SL are isolated from each other. In this embodiment, the boundary line C of the second insulating layer 180 remains on the insulating substrate 110 although the portion of the insulating substrate 110 is cut at the cutting line B, and the boundary of the second insulating layer 180 has a curved or crenellated shape. Here, the protruded portion of the boundary line C of the second insulating layer 180 may be disposed to align directly beneath with respect to each the connection members 86, or not.

In this embodiment according to the present disclosure, when etching the conductive layer to form the contact assistants 87, the connection members 86, and the common connection member 84, conductive particles may remain on the boundary line C of the second insulating layer 180. However, because the boundary line C of the second insulating layer 180 is curved or crenellated, the length of the boundary of the second insulating layer 180 between the neighboring connection member 86 is extended. Accordingly, a short circuit between the neighboring connection members 86 via the conductive particles of the conductive layer is less likely to be generated. Also, because the length of the boundary line C of the second insulating layer 180 between the neighboring connection member 86 is extended, the portion where the conductive layer is completely removed between the neighboring connection member 86 is increased. Accordingly, a short circuit between neighboring connection members 86 via the conductive particles of the conductive layer may be effectively prevented. Also, in addition to the boundary line C of the second insulating layer 180 being curved or crenellated, the profile of the slope of the step of the boundary line C is gradual. Accordingly, the conductive layer between the neighboring connection members 86 may be completely removed in the lithography process, such that the short circuit between the neighboring connection members 86 may be effectively prevented.

Figure 7:
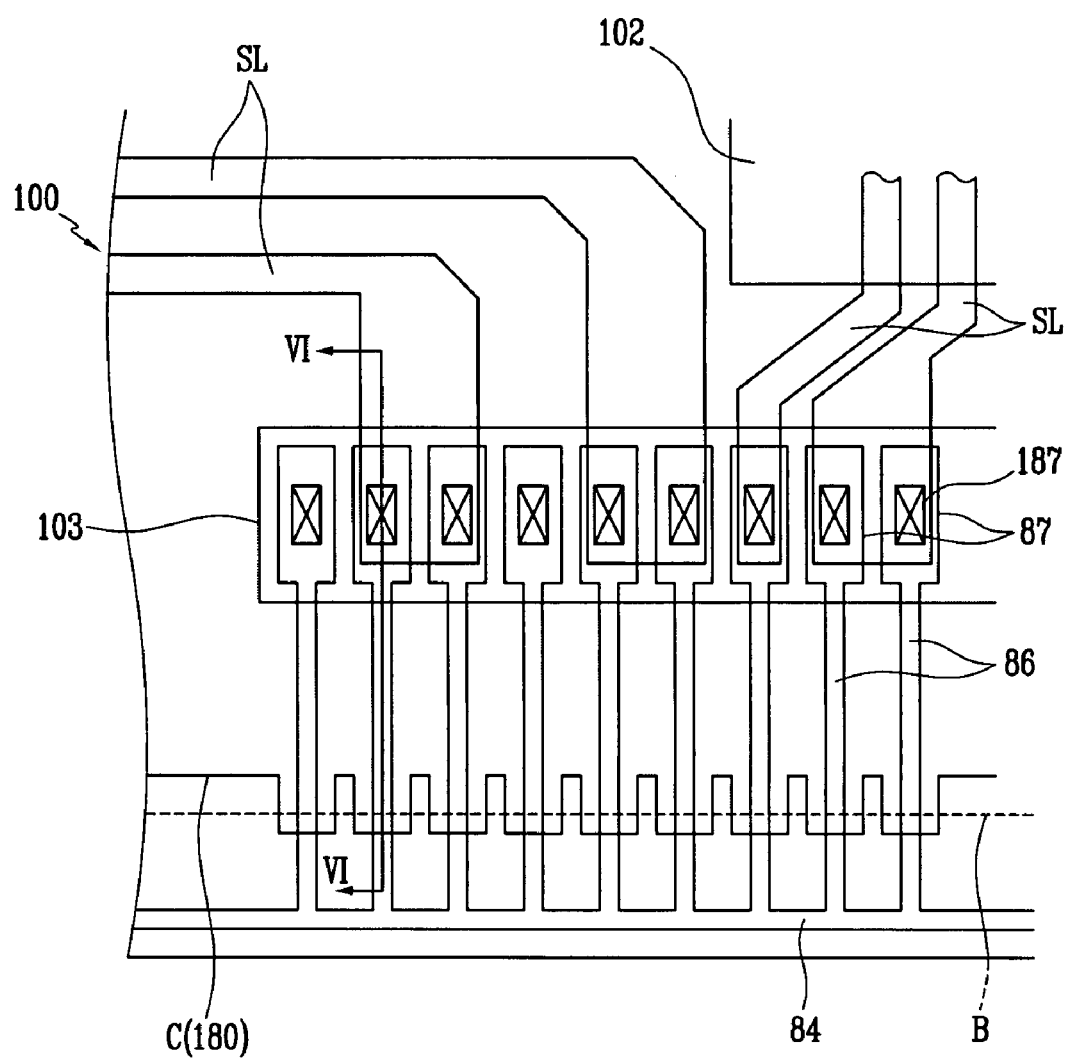
FIG. 7 is an enlarged plan view of the portion of a thin film transistor array panel according to another exemplary embodiment of the present invention.
Figure 8:
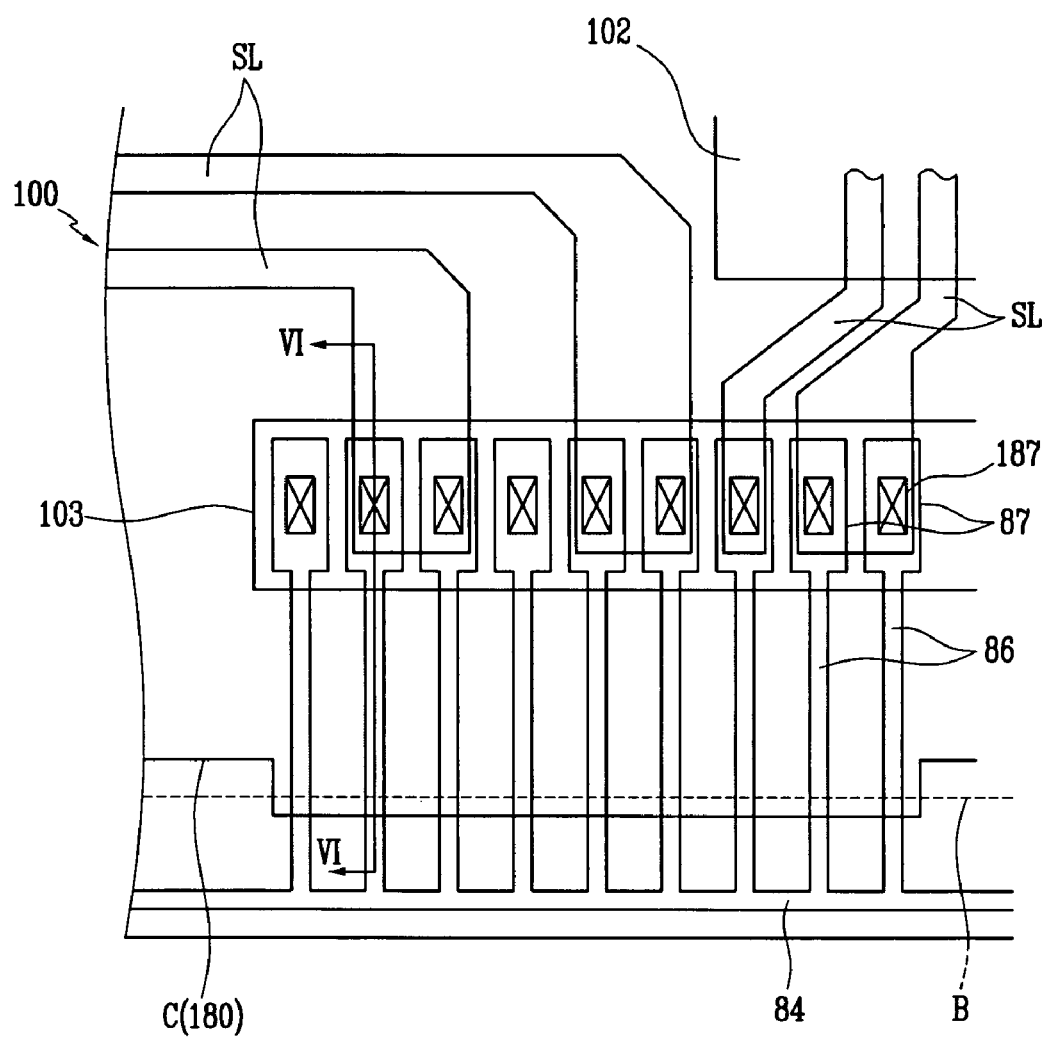
FIG. 8 is an enlarged plan view of the portion of a thin film transistor array panel according to another exemplary embodiment of the present invention.

FIG. 7 is an enlarged view of the portion of a thin film transistor array panel according to another exemplary embodiment of the present invention, and FIG. 8 is an enlarged view of a portion of a thin film transistor array panel according to yet another exemplary embodiment of the present invention.

Most of the cross-sectional structure according to this embodiment is the same as that of the previous embodiment, so a detailed description of the cross-sectional structure is omitted.

The structure of the thin film transistor array panel according to these embodiments of the present invention are the same as that of the previous embodiment.

However, the curved or crenellated boundary line C of the second insulating layer 180 (referring to FIG. 7) intersects the cutting line B, such that the second insulating layer 180 under the connection member 86 passes the cutting line B and is extended adjacent to the common connection member 84, and the second insulating layer 180 between the neighboring connection members 86 is formed inside the cutting line B. In this embodiment, when the portion of the insulating substrate 110 (referring to FIG. 6) is cut at the cutting line B, the cross-section of the second insulating layer 180 disposed under the connection members 86 is externally exposed. Accordingly, the boundary lines of the second insulating layer 180 under the connection member 86 accord with the boundary line of the insulating substrate 110, and the rest of the curved or crenellated boundary line C of the second insulating layer 180 is disposed inside the boundary of the insulating substrate 110. That is to say, the a portion of the curved or crenellated boundary line C of the second insulating layer 180 formed by etching is retained between the connection members 86.

When etching the conductive layer to form the contact assistants 87, the connection members 86, and the common connection member 84, although the conductive particles may remain on the boundary line C of the second insulating layer 180, because the curved or crenellated boundary line C of the second insulating layer 180 is cut along cutting line B, as shown in FIG. 7, between the connection members 86, the short circuit between the neighboring connection members 86 may be prevented.

In another embodiment according to the present disclosure, as shown in FIG. 8, the boundary line C of the second insulating layer 180 is disposed beyond the cutting line B in the region where the connection members 86 are formed. In this embodiment, when the portion of the insulating substrate 110 (referring to FIG. 8) is cut at the cutting line B, most of the cross-section of the second insulating layer 180 disposed under the connection members 86 is externally exposed, and the boundary line C of the second insulating layer 180 formed by etching only remains outside two outermost connection members 86 that are disposed at the edges of the array of connection members 86 that are formed by etching.

Accordingly, though the conductive particles remain on the boundary line C of the second insulating layer 180, because the etched boundary line C of the second insulating layer 180 does not remain between the connection members 86, short circuits between the neighboring connection members 86 may be prevented.

While LCDs are provided as the embodiments according to the present invention, the structures according to the present invention may be adapted to an organic light emitting display (OLED) or a plasma display panel (PDP).

As above-described, the boundary line of the insulating layer disposed under the connection members is curved or crenellated, or the portion of the insulating layer is exposed between the connection members, and accordingly a short circuit between the neighboring connection members 86 may be prevented.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel, comprising:
   a substrate including a display region, a chip region, and a pad region;
   a plurality of signal lines formed on the substrate for electrically connecting the pad region to the chip region and the display region, wherein the signal lines include pad portions located in the pad region;
   an insulating layer covering the signal lines, the insulating layer including a plurality of contact holes exposing portions of the signal lines;
   a plurality of contact assistants formed on the insulating layer, wherein the contact assistants are connected to the pads through the contact holes; and
   a plurality of connection members formed on the insulating layer and being connected to an associated contact assistant for selectively commonly electrically connecting the signal lines,
   wherein the insulating layer has a boundary line having a first portion which extends beneath the plurality of connection members at a first distance from an edge of the pad region, and at least one second portion adjacent to any outermost one of the plurality of connection members, the at least one second portion being positioned a second lesser distance from the edge of the pad region.

2. The thin film transistor array panel according to claim 1, wherein the at least one second portion comprises a plurality of second portions, and further wherein at least one of the plurality of second portions is positioned between adjacent pairs of the connection members.

3. The thin film transistor array panel according to claim 2, wherein the first and second portions of the boundary line define a crenellated pattern having protruded portions, and further wherein each of the connection members extends above an associated protruding portion of the crenellated pattern.

4. The thin film transistor array panel according to claim 1, wherein the panel is further defined by a process which severs the plurality of connection members and a portion of the insulating layer at a location between the first portion of the boundary line of the insulating layer and the at least one second portion of the boundary line.

5. The thin film transistor array panel according to claim 1, wherein the connection members are connected to a common connection member, and further wherein the panel is further defined by a process which severs the plurality of connection members at a location between the boundary line of the insulating layer and the common connection member.

6. The thin film transistor array panel according to claim 2, wherein the connection members are connected to a common connection member, and further wherein the panel is further defined by a process which severs the plurality of connection members at a location between the boundary line of the insulating layer and the common connection member.

7. The thin film transistor array panel according to claim 3, wherein the connection members are connected to a common connection member, and further wherein the connection members are connected to a common connection member, and further wherein the panel is further defined by a process which severs the plurality of connection members at a location between the protruding portions and the common connection member.

8. The thin film transistor array panel of claim 4, wherein the portion of the insulating layer between two connection members disposed in the edge is exposed by the boundary of the substrate.

9. The thin film transistor array panel of claim 1, further comprising a driving chip mounted in the chip region using a chip on glass (COG) mounting technique.

* * * * *